United States Patent

Lin et al.

[11] Patent Number: 5,998,869
[45] Date of Patent: Dec. 7, 1999

[54] HIGH STORAGE CAPACITY, WIDE DATA INPUT/OUTPUT CHANNEL, STATIC RANDOM ACCESS MEMORY DEVICE

[75] Inventors: Hung-Hsueh Lin, Taipei; Hsin-Chang Lin; Kow-Liang Wen, both of Hsinchu, all of Taiwan

[73] Assignee: Winbond Electronics Corp., Taiwan

[21] Appl. No.: 08/938,629

[22] Filed: Sep. 26, 1997

[30] Foreign Application Priority Data

Jul. 17, 1997 [TW] Taiwan .................................. 86110125

[51] Int. Cl.$^6$ ........................... H01L 23/48; H01L 23/52; H01L 29/40; H01L 23/495
[52] U.S. Cl. ............................................. 257/734; 257/666
[58] Field of Search ........................................ 257/666, 734

[56] References Cited

U.S. PATENT DOCUMENTS 5,457,340  10/1995  Templeton, Jr. et al. ............... 257/666
5,543,657   8/1996  Diffenderfer et al. ................... 257/666

Primary Examiner—Olik Chaudhuri
Assistant Examiner—Howard Weiss
Attorney, Agent, or Firm—Rabin & Champagne, PC

[57] ABSTRACT

A high storage capacity, wide data channel SRAM having a 64-bit wide data input/output channel, 4 Mbyte or 2 Mbyte of memory, and packaged as a 100-pin QFP or TQFP. The SRAM can be a substitute for a conventional 128 pin QFP or TQFP SRAM because all the functions including pipeline burst transmission are present. Moreover, the SRAM has a comparatively lower package testing and production cost.

7 Claims, 5 Drawing Sheets

HIGH STORAGE CAPACITY, WIDE DATA INPUT/OUTPUT CHANNEL, STATIC RANDOM ACCESS MEMORY DEVICE

BACKGROUND OF THE INVENTION

1. Field of Invention

The present invention relates to a high storage capacity, wide data input/output channel, static random access memory (SRAM) device. More particularly, the present invention relates to a static random access memory device having 100 pins, a 64-bit data input/output channel and a 4 megabyte (4 Mbyte) storage capacity.

2. Description of Related Art

In the present information explosion era, personal computers have become indispensable tools in our daily lives. Personal computers help us in many ways, such as processing data, managing documents and transmitting information. At present, the main board of most personal computers either has a 256 KB or 512 KB cache memory for enhancing its memory function, and the cache memory is made up of SRAM chips.

A conventional SRAM having a 32-bit wide data input/output channel and 2Mbyte or 1 Mbyte storage capacity is generally assembled as a 100-pin integrated circuit (IC) and is packaged into either a quad flat package (QFP) or a thin quad flat package (TQFP). FIG. 1 shows the pin layout diagram of a conventional 32-bit data channel, 100 pins and 1 Mbyte SRAM. As shown in FIG. 1, this type of SRAM requires 1 clock pulse pin (CLK); 15 address pins (A0–A14); 32 data input/output pins (I/O 1–I/O 32); 6 write control pins (/BWE, /BW1–/BW4, /GW); 1 output control pin (/OE); 3 chip control pins (/CE1, /CE2, /CE3); 3 pipeline burst transmission control pins (/ADV, /ADSC, /ADSP); 1 burst transmission mode selection pin (/LBO); 1 fetch cycle mode control pin (/FT); 1 energy saving mode control pin (ZZ); 12 power pins (VDDQ/VDD); and 12 ground pins (VSSQ/VSS). A total of 88 pins are used. The remaining 12 pins are no-contact pins (NC) and are there for future expansion.

For personal computers having a 512 KB main board cache memory, if memory can be accessed by a 32-bit wide data I/O channel, then two 2 Mbyte SRAM chips or four 1 MByte SRAM chips are required. But if memory can be accessed by a 64-bit wide data I/O channel, the cache memory can be implemented using one 4 Mbyte SRAM chip. Because one 4 Mbyte SRAM occupies less board area than either two 2 Mbyte SRAM or four 1 Mbyte SRAM, some main board area can be saved. However, due to the generation of a high output current when data is input or output through the 64-bit input/output data channel, delta I noises are created. These delta I noises may result in erroneous SRAM operations. To reduce interference caused by these delta I noises, more pins are normally necessary. FIG. 2 shows the pin layout diagram of a conventional 64-bit data channel, 128 pin, 2 Mbyte SRAM. As shown in FIG. 2, the SRAM requires 1 clock pulse pin (CLK); 15 address pins (A0–A14); 64 data input/output pins (I/O 1–I/O 64); 10 write control pins ($\overline{BWE}$, $\overline{BW1}$–$\overline{BW8}$, $\overline{GW}$); 1 output control pin ($\overline{OE}$); 5 chip control pins ($\overline{CE1}$, $\overline{CE2}$, $\overline{CE3}$, CE4, CE5); 3 pipeline burst transmission control pins ($\overline{ADV}$, $\overline{ADSC}$, $\overline{ADSP}$); 1 burst mode control pin (MODE); 1 energy saving mode control pin (ZZ); 12 power pins (VCCQ/VCC); and 12 ground pins (GNDQ/GND). Of the total 128 pin, 125 pins are used. Only 3 pins are no-contact pins (NC) and are there for future expansion. Because the above SRAM has a larger number of pins, more main board area is needed for wiring. Moreover, the layout of the main board needs to be rescheduled and new testing procedures need to be implemented due to the extra pins, thereby increasing the cost of production. In light of the foregoing, there is a need in the art for improving the pin use and layout of the 64-bit, 128 pin, 4 Mbyte SRAM.

SUMMARY OF THE INVENTION

Accordingly, the present invention is directed to providing a high storage capacity, wide data channel SRAM having 64-bit wide data input/output lines, 4 Mbyte memory storage capacity and 100 pins. Because altogether there are only 100 pins, the SRAM of this invention can be used directly on existing main boards without the need for re-designing the layout or re-scheduling the testing procedures. The SRAM retains all the pipeline burst functions of a conventional SRAM. Furthermore, because a single 4 Mbyte SRAM occupies less area compared to the combination of two conventional 2 Mbyte SRAMs, or the combination of four conventional 1 Mbyte SRAMs, the size of the main board can be reduced. As a result, testing procedures are much simpler and the cost of production is reduced compared with a conventional 128 pin, 4 Mbyte SRAM.

To achieve these and other advantages and in accordance with a purpose of the invention, as embodied and broadly described herein, the invention includes a high storage capacity, 64-bit wide data channel SRAM comprising a wafer having a plurality of bonding pads; a lead frame having at least one die paddle and 100 pins, and at least one pin is coupled to at least one bonding pad. Furthermore, the 100 pins in the SRAM are functionally divided into groups, including 1 clock pulse pin; 16 address pins; 64 data input/output pins; 10 write control pins; 1 output control pin; 1 chip control pin; 3 pipeline burst transmission control pins; 2 power pins; and 2 ground pins.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate an embodiment of the invention and, together with the description, serve to explain the principles of the invention. In the drawings.

DESCRIPTION OF THE PREFERRED EMBODIMENTS

Figure 1:
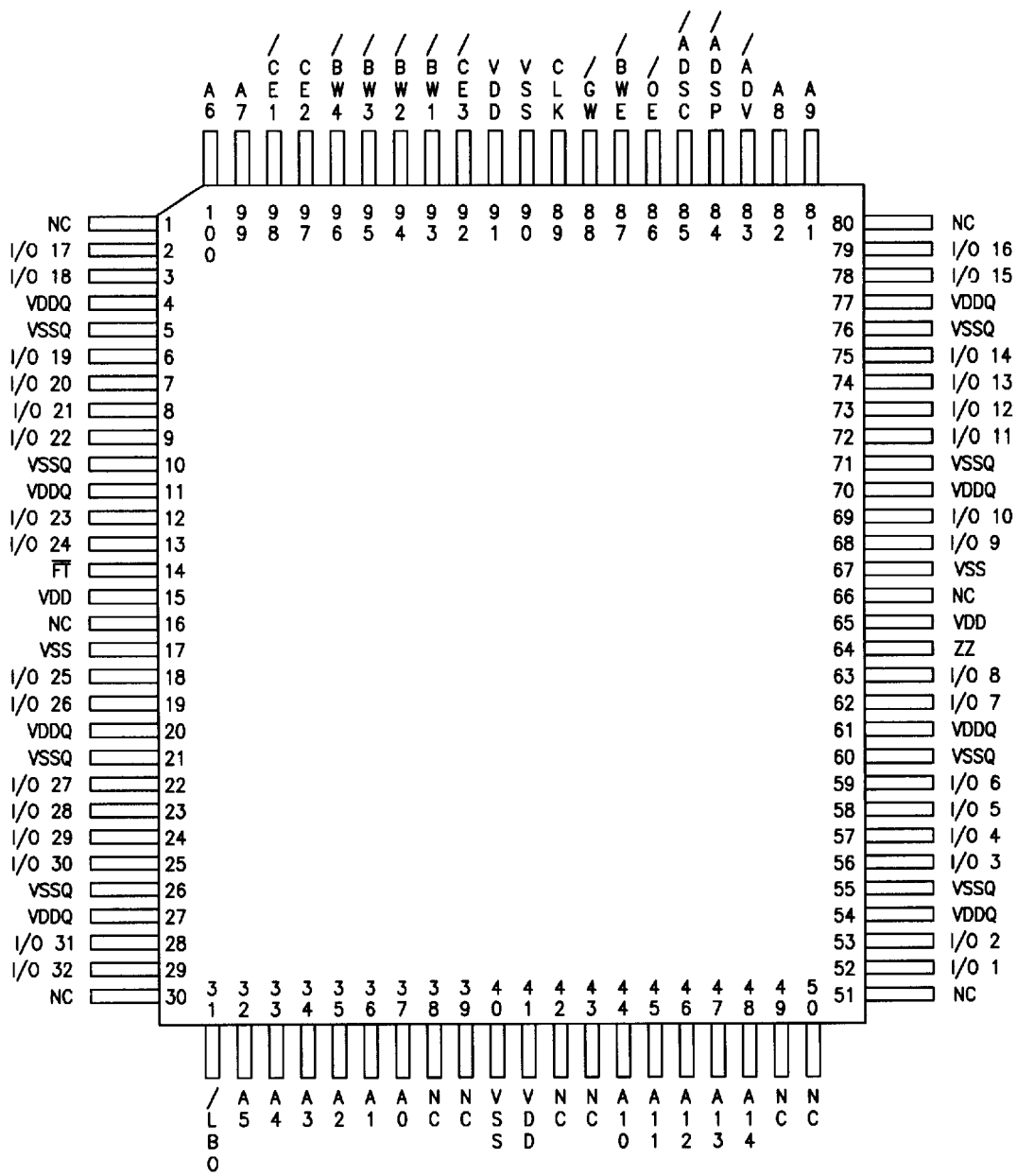
FIG. 1 shows a pin layout diagram of a conventional 32-bit wide data I/O channel, 100 pins, 1 Mbyte SRAM.
Figure 2:
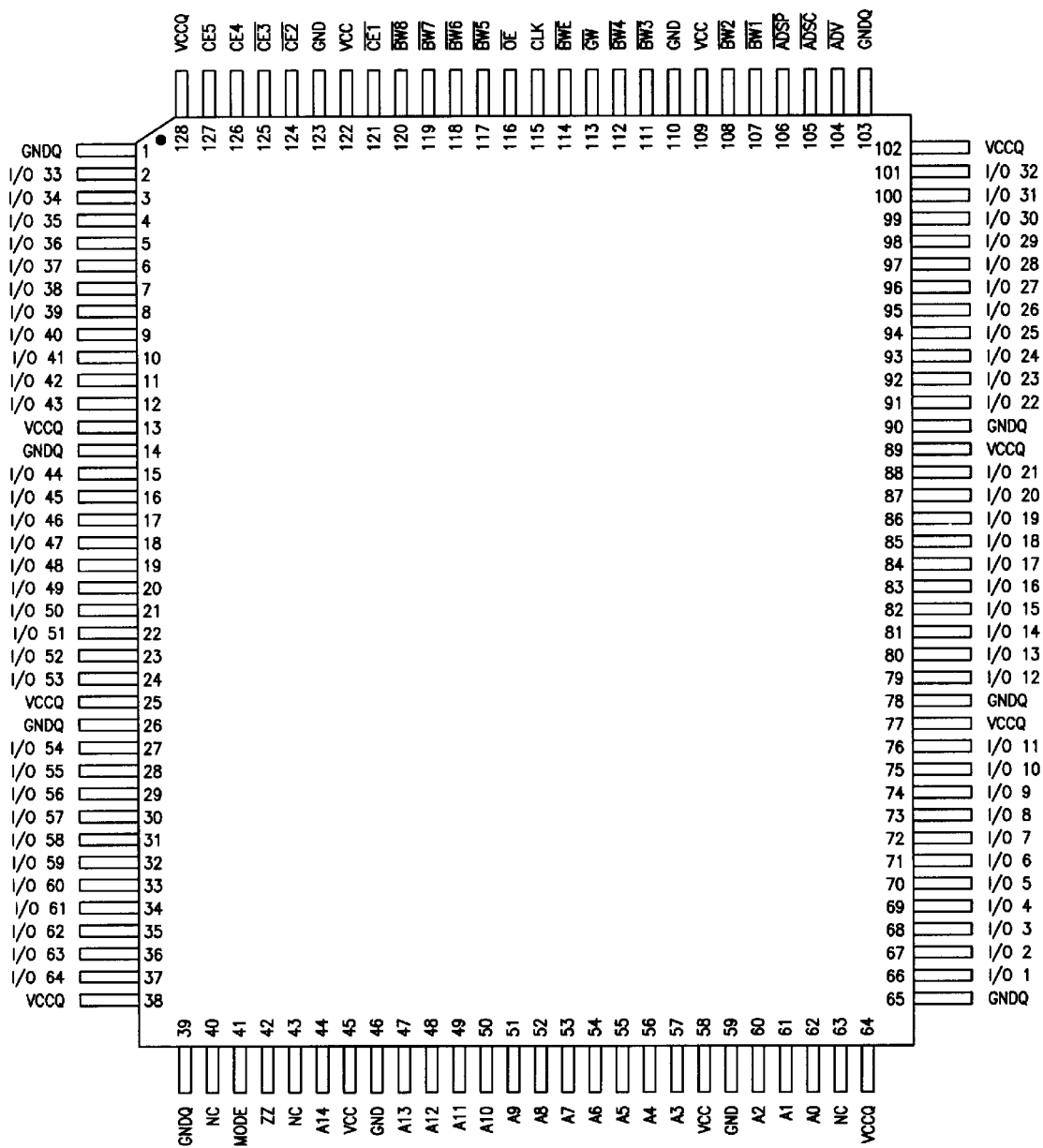
FIG. 2 shows a pin layout diagram of a conventional 64-bit wide data I/O channel, 128 pins, 2 Mbyte SRAM.

Reference will now be made in detail to the present preferred embodiments of the invention, examples of which are illustrated in the accompanying drawings. Wherever possible, the same reference numbers are used in the drawings and the description to refer to the same or like parts.

Figure 3:
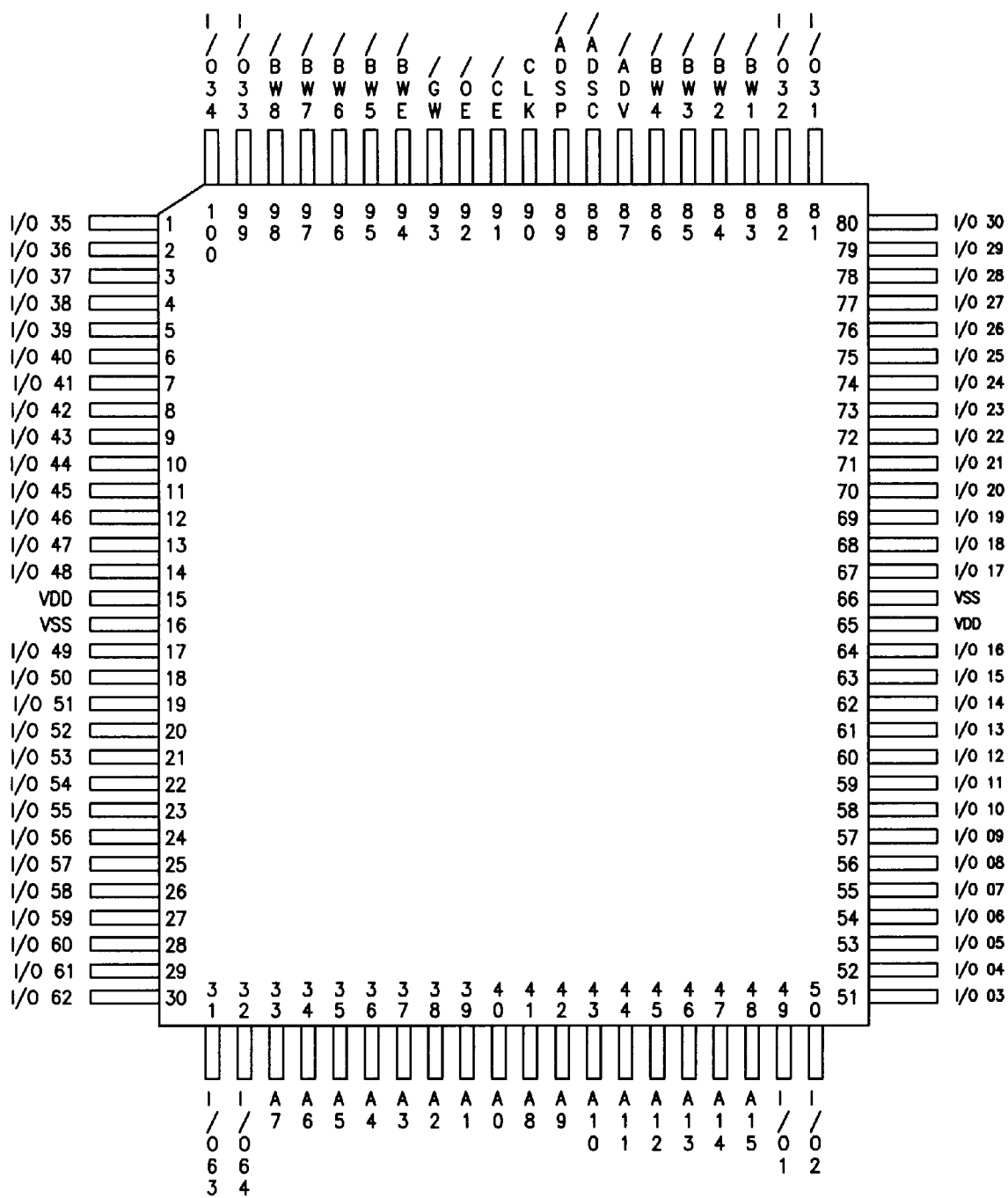
FIG. 3 shows a pin layout diagram of a 64-bit wide data I/O channel, 100 pins, 4 Mbyte SRAM according to one preferred embodiment of the invention.

FIG. 3 shows a pin layout diagram of a 64-bit wide data I/O channel, 100 pins, 4 Mbyte SRAM according to a preferred embodiment of the invention. As shown in FIG. 3, the SRAM has a 64-bit wide data channel, a storage capacity of 4 Mbyte and is packaged as a 100-pin QFP or TQFP. Because the read/write operation of a 64-bit wide data channel involves a large output current, delta I noises are generated. In addition, as a result of the pin number reduction in the invention, the number of power and ground pins available for connection is smaller. Therefore, power and ground wirings inside the wafer must be re-scheduled to minimize delta I noises and to reduce the number of pins. The 4 Mbyte SRAM of the invention requires 1 clock pulse pin (CLK); 16 address pins (A0–A15); 64 data input/output pins (I/O 1–I/O 64); 10 write control pins (/BWE, /BW1–/BW8, /GW); 1 output control pin (/OE); 1 chip control pin (/CE); 3 pipeline burst transmission control pins (/ADV, /ADSC, /ADSP); 2 power pins (VSS); and 2 ground pins (VDD). The conventional burst mode selection pin (/LBO) and the fetch cycle mode control pin (/FT) are deleted in the present invention. Those functions are achieved by other means explained below.

Since the burst mode selection pin (/LBO) and the fetch cycle mode control pin (/FT) have no direct effect on the proper operation of a pipelined memory system, modes can be pre-selected and hardwired during the wafer fabrication. For example, an Intel System burst transmission mode or a linear burst transmission mode can be pre-selected, and then the hardwiring can be achieved by using a suitable photomask during wafer fabrication; or the hardwiring can be achieved by burning off or keeping poly-fuses on the wafer using laser equipment. Similarly, the fetch cycle mode can also be pre-selected and then hardwired during fabrication. Because pulse-less operation is allowed after the completion of a data read/write mode, the clock pulse pin can be set to a logic low without affecting the component states or stored data in the SRAM chip. Since a large amount of energy is already saved under a pulse-less operation, there is no need for the specific selection of an energy saving mode by a pin. Therefore, the energy saving mode control pin (ZZ) can be deleted as well.

To reduce the number of power/ground pins, a multi-wire bonding method can be used. In the multi-wire bonding method, several bonding pads are wired to a single pin using a wire bonding machine. Since the multi-wire bonding is equivalent to a number of wires connected in parallel, inductive reactance is thereby reduced. Delta I noises are produced whenever a read/write operation is performed by a 64-bit wide data channel. As delta I noises can cause spurious signals in other circuits, power lines/ground lines and pin positions need to be laid out properly. Mainly, the power lines/ground lines of output buffering devices are separated and isolated, by design, from the power lines/ground lines of internal decoding circuits and controlling circuits (including input buffering devices). Through this arrangement, signal coupling between output buffering devices and internal circuits is prevented.

Basically, there are two ways to connect the SRAM circuits within the wafer chip with the two sets of available power/ground pins in the lead frame. Which way is used depends on the system design, and they are described below.

(A) Two sets of power/ground pins both supplied with the same working potential level (For example, 3.3 volts).

Figure 4:
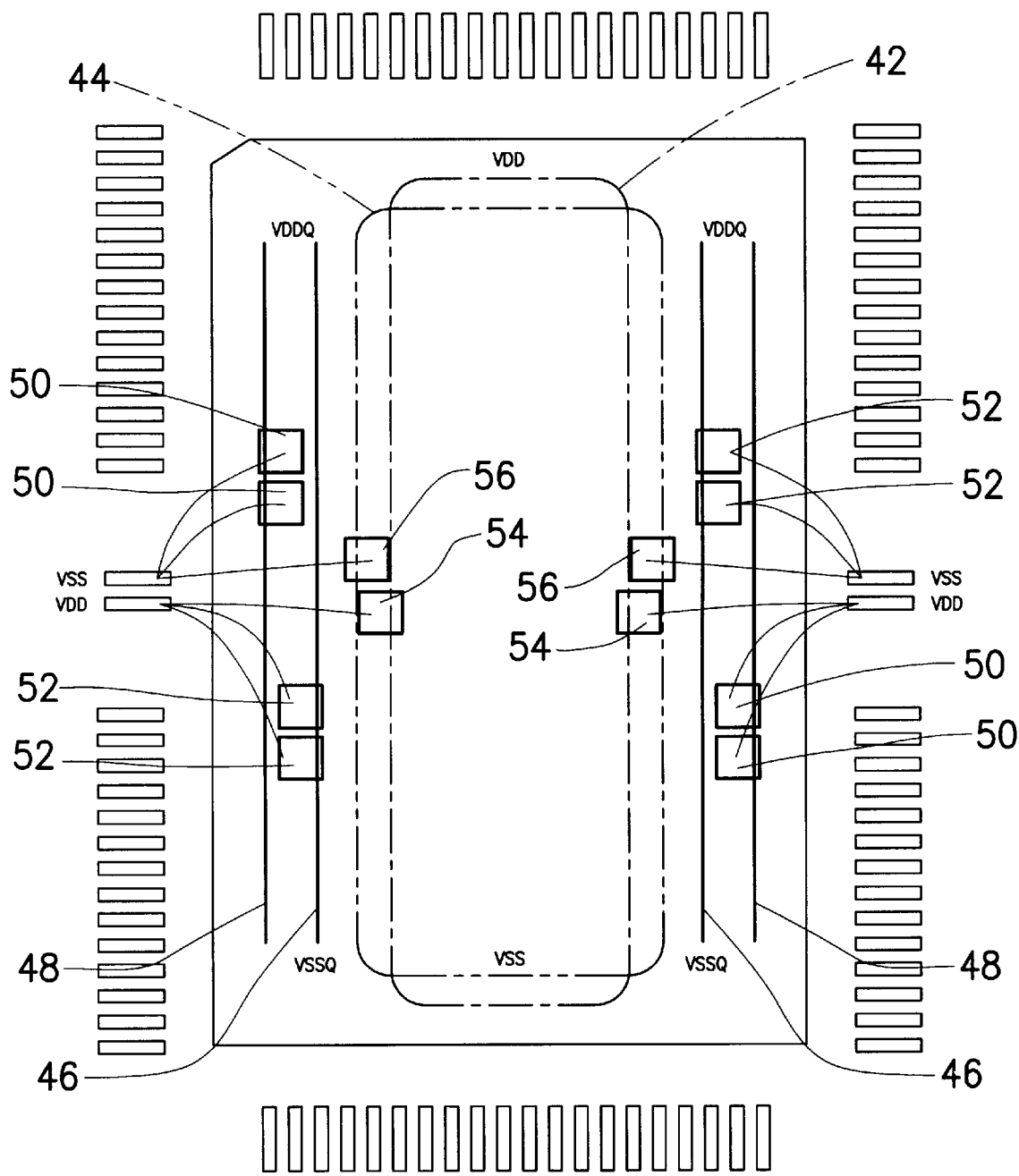
FIG. 4 is a schematic layout diagram of internal circuit power lines, output power lines and their associated pin/bonding pad connections of the SRAM in FIG. 3 for use in a system having two sets of power/ground pins both supplied with the same working potential level.

In general, SRAM power pads can be classified into output power pads (VDDQ/VSSQ pads) and internal circuit power pads (VDD/VSS pads). These two type of power pads correspond to two different power line layouts. FIG. 4 is a schematic layout diagram of internal circuit power lines, output power lines and their associated pin/bonding pad connections of the SRAM shown in FIG. 3, for use in a system having two sets of power/ground pins both supplied with the same working potential level. Delta I noises can be reduced by minimizing return circuit area. As shown in FIG. 4, this can be achieved by placing the power pads that have connections with the power/ground lines of the output buffering devices, and the power pads that have connections with the power/ground lines of the internal circuits (including the input buffering devices) symmetrically along two opposite sides of the wafer. In FIG. 4, return circuit 42 is a return circuit for all the internal circuit power lines VDD; return circuit 44 is a return circuit for all the internal circuit power lines VSS; power lines 48 are return circuits for all the output power lines VDDQ; and ground lines 46 are return circuits for all the output power ground lines VSSQ. Bonding pads 50 are connected to output power lines VDDQ; bonding pads 52 are connected to output power lines VSSQ; bonding pads 54 are connected to internal circuit power lines VDD; and bonding pads 56 are connected to internal circuit power lines VSS. Because the same working potential level is applied to both the internal circuit power lines and the output power lines, power pads on the VDDQ line and the VDD line on one side of the wafer can be coupled to the same VDD pin nearest them. Similarly, power pads on the VSSQ line and VSS line on one side can be coupled to the same VSS pin nearest them. In addition, all the power pads along the output power lines VDDQ/VSSQ and the internal circuit power lines VDD/VSS can be disposed evenly on two opposite sides of the wafer for the reduction of return circuit area.

Internally, the power/ground lines of the output buffering devices and the power/ground lines of the internal circuits (including the input buffering devices) are laid out separately and isolated from each other. Furthermore, each respective line is connected to its corresponding power pads. Another arrangement to reduce delta I noises is to couple together all the power lines of the first 32 data output buffering devices (I/O 1–I/O 32) of the wafer and connect them to the nearest power pin on one side of the lead frame. Similarly, all the power lines of the second 32 data output buffering devices (I/O 33–I/O 64) are coupled together and connected to the nearest power pin on the opposite side of the lead frame.

(B) Each set of power/ground pins supplied with a different working potential level (For example, 3.5 volts and 2.5 volts, respectively)

Figure 5:
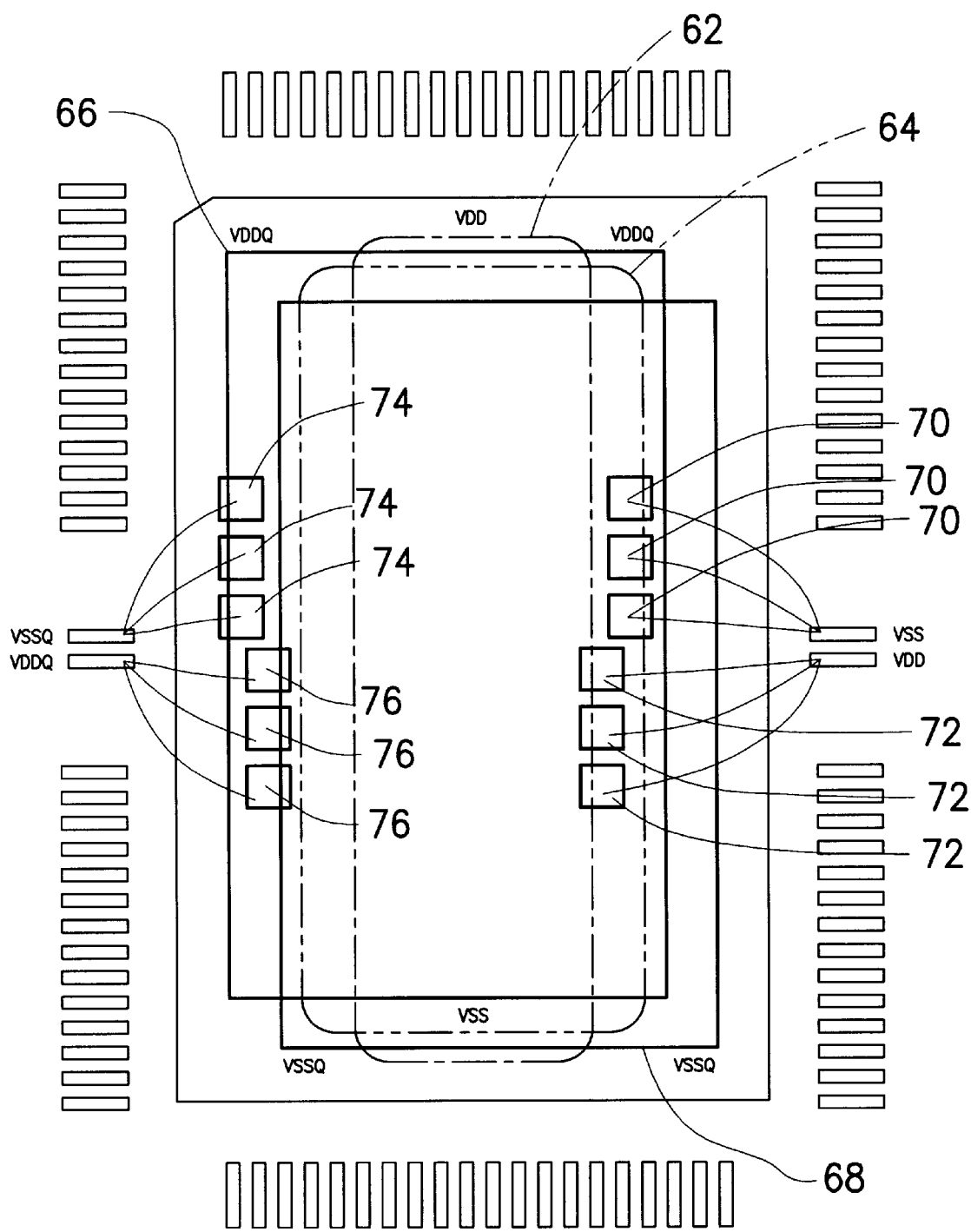
FIG. 5 is a schematic layout diagram of internal circuit power lines, output power lines and their associated pin/bonding pad connections of the SRAM in FIG. 3 for use in a system having two sets of power/ground pins each supplied with a different working potential level.

FIG. 5 is a schematic layout diagram of internal circuit power lines, output power lines and their associated pin/bonding pad connections of the SRAM in FIG. 3 for use in a system having two sets of power/ground pins each supplied with a different working potential level. As shown in FIG. 5, the output power pads (VDDQ/VSSQ pads) and the internal circuits power pads (VDD/VSS pads) are disposed on opposite sides of the wafer. In other words, the output power pads are placed along one side of the wafer, and the internal circuit power pads are placed along the opposite side of the wafer. The power pads are multiple-bonded to their corresponding power pins. Also, as shown in FIG. 5, return circuit 62 is a return circuit for all the internal circuit power lines VDD; return circuit 64 is a return circuit for all the internal circuit power lines VSS; return circuit 66 is a return circuit for all the output power lines VDDQ; and return circuit 68 is a return circuit for all the output power lines VSSQ. Bonding pads 74 are connected to output power lines VDDQ; bonding pads 76 are connected to output power lines VSSQ; bonding pads 72 are connected to internal circuit power lines VDD; and bonding pads 70 are connected to internal power lines VSS.

Internally, the power/ground lines of the output buffering devices and the power/ground lines of the internal circuits (including the input buffering devices) are laid out separately and isolated from each other. Such internal power/ground line layout are normally achieved through suitable photomask selection during wafer fabrication. Furthermore, the respective lines are connected to their corresponding power pads. Because the internal power/ground line layout for this type of SRAM is not balanced, those data output buffering devices (half of the 64 I/O devices) furthest away from the power pin position can have a bigger delta I noise return circuit area. Therefore, this arrangement may result in output signal waveform degradation. To tackle this problem, the power/ground lines of the output buffering devices can be made wider, or a metallic connecting layer can be added to act as power/ground lines of the output buffering devices.

Apart from the two aforementioned types of power pin layout (A) & (B), for 100 pin QFP or TQFP, the lead frame supported die paddle can be utilized by connecting to suitable power pins (for example, the VDD line) during SRAM fabrication (for example, SRAM having an N-type substrate). Utilizing the die paddle, suitable dummy internal power pads, for example, VDD pads, can be added to the wafer, and then the pads are directly wire-bonded to the die paddle. Current flowing from the power pads through the conductive metallic lead frame to the corresponding power pins can lower inductive reactance and reduce delta I noise return circuit area. When a single working potential level is used throughout the power pins, this method of wire bonding to the die paddle can be applied to connect the power/ground lines of the output buffering devices with the power/ground lines of the internal circuit (including the input buffering devices) through internal bonding pads, and thereby eliminating one more power pin (for example, a VDD pin). Also, the above method is capable of lessening the effect of delta I noises on other internal circuits generated by the output buffering devices.

Another technique of reducing delta I noises is to add a certain time delay between buffering devices. This has the effect of lowering current change rates when data is output from the buffering devices.

It is obvious from the above description that the present invention provides a high storage capacity wide data channel SRAM having 64-bit wide data input/output lines, 4 Mbyte memory storage capacity and 100 pins. Because there are only 100 pins altogether, the SRAM of this invention can be used directly on existing main boards without the need for re-designing the layout or re-scheduling the testing procedures. The SRAM retains all the pipeline burst functions of a conventional SRAM. Furthermore, because a single 4 Mbyte SRAM occupies less area compared to the combination of two conventional 2 Mbyte SRAMs, or the combination of four conventional 1 Mbyte SRAMs, the size of the main board can be reduced. As a result, testing procedures are much simpler and the cost of production is reduced compared with a conventional 128 pin, 4 Mbyte SRAM. Although the number of pins used in the SRAM of the invention is considerably reduced, all the functions in a conventional 128-pin SRAM are present. Furthermore, the SRAM fabricated according to the invention has been tested and verified to conform to standards.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A SRAM having a 64-bit wide data input/output channel, comprising:

a wafer having a plurality of bonding pads; and a lead frame having at least one die paddle and exactly 100 pins, with at least one of said pins being coupled to at least one of said bonding pads, wherein the 100 pins of the lead frame are functionally divided into the following groups, including:
1 clock pulse pin;
16 address pins;
64 data input/output pins;
10 write control pins;
1 output control pin;
1 chip control pin;
3 pipeline burst transmission control pins;
2 power pins; and
2 ground pins.

2. The SRAM of claim 1, wherein said wafer further comprises a hardwired pre-selected mode, which includes photomask-formed hardwiring, and which replaces a pin-selected burst transmission mode in a conventional SRAM.

3. The SRAM of claim 1, wherein said wafer further comprises a hardwired pre-selected mode, which includes laser-created poly-fuses hardwiring, and which replaces a pin-selected burst transmission mode in a conventional SRAM.

4. The SRAM of claim 1, wherein said SRAM is adapted for a pulseless operation.

5. The SRAM of claim 1, wherein each of said power pins is coupled to at least three of said bonding pads.

6. The SRAM of claim 1, wherein each of said ground pins is coupled to at least three of said bonding pads.

7. The SRAM of claim 1, wherein said wafer further includes a plurality of dummy internal power pads all coupled to said die paddle.

* * * * *